(12) United States Patent
Koehler et al.

(10) Patent No.: US 6,580,767 B1
(45) Date of Patent: Jun. 17, 2003

(54) CACHE AND CACHING METHOD FOR CONVENTIONAL DECODERS

(75) Inventors: Kevin P. Koehler, Palatine, IL (US); Terry Michael Schaffner, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/425,756

(22) Filed: Oct. 22, 1999

(51) Int. Cl.[7] .............................. H03D 1/00; H04L 23/02
(52) U.S. Cl. ........................................ 375/341; 375/262
(58) Field of Search .......................... 375/341, 232–260

(56) References Cited

U.S. PATENT DOCUMENTS

| | | | |
|---|---|---|---|
| 5,822,341 A | * 10/1998 | Winterrowd et al. | 714/795 |
| 5,933,462 A | 8/1999 | Viterbi et al. | |
| 5,983,328 A | * 11/1999 | Potts et al. | 711/157 |
| 6,028,899 A | * 2/2000 | Petersen | 375/341 |
| 6,425,054 B1 | * 7/2002 | Nguyen | 711/117 |

OTHER PUBLICATIONS

"Near Shannon Limit Error–Correcting Coding and Decoding: Turbo–Codes",: by C. Berrou et al., Proceedings of ICC '93, Geneva, Switzerland, pp. 1064–1070, May, 1993.

"Efficient Implementation of Continuous MAP Decoders and a Synchronisation Technique for Turbo Decoders", by Steven S. Pietrobon, International Symposium on Information Theory and its Applications, Victoria, BC Canada, pp. 586–589, Sep. 1996.

"An Intuitive Justification and a Simplified Implementation of the MAP Decoder for Convolutional Codes", by A Viterbi, IEEE Journal on Selected Areas in Communications, vol. 16, No. 2, Feb. 1998.

* cited by examiner

*Primary Examiner*—Stephen Chin
*Assistant Examiner*—Lawrence Williams
(74) *Attorney, Agent, or Firm*—Kenneth A. Haas

(57) ABSTRACT

A method and cache for caching encoded symbols for a convolutional decoder with forward and backward recursion includes storing different encoded symbols of an encoded frame in each of a plurality of symbol memory elements (200, 202, 400) and routing the same encoded symbols from one of the plurality of symbol memory elements (200, 202, 400) to at least both a forward recursion decoder (208) and a backward recursion decoder (210, 402). The plurality of symbol memory elements may be, for example, single port RAM cells, each operatively controlled to receive different encoded symbols of an encoded frame as input. Control logic (204) routes the same encoded symbols from one of the plurality of symbol memory elements (200, 202, 400) to all of the recursion decoders (208, 210, 402).

20 Claims, 7 Drawing Sheets

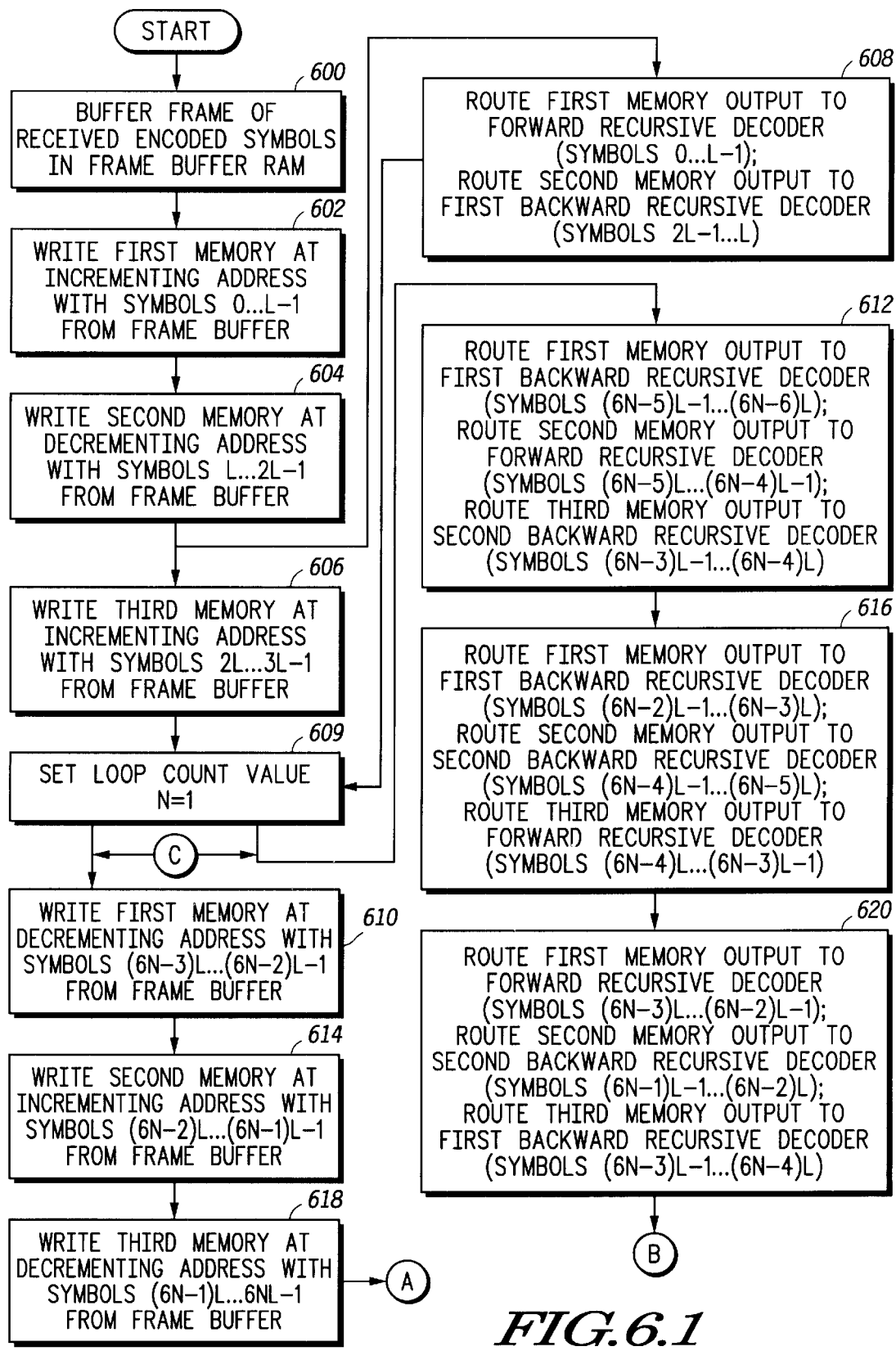
FIG.6.1

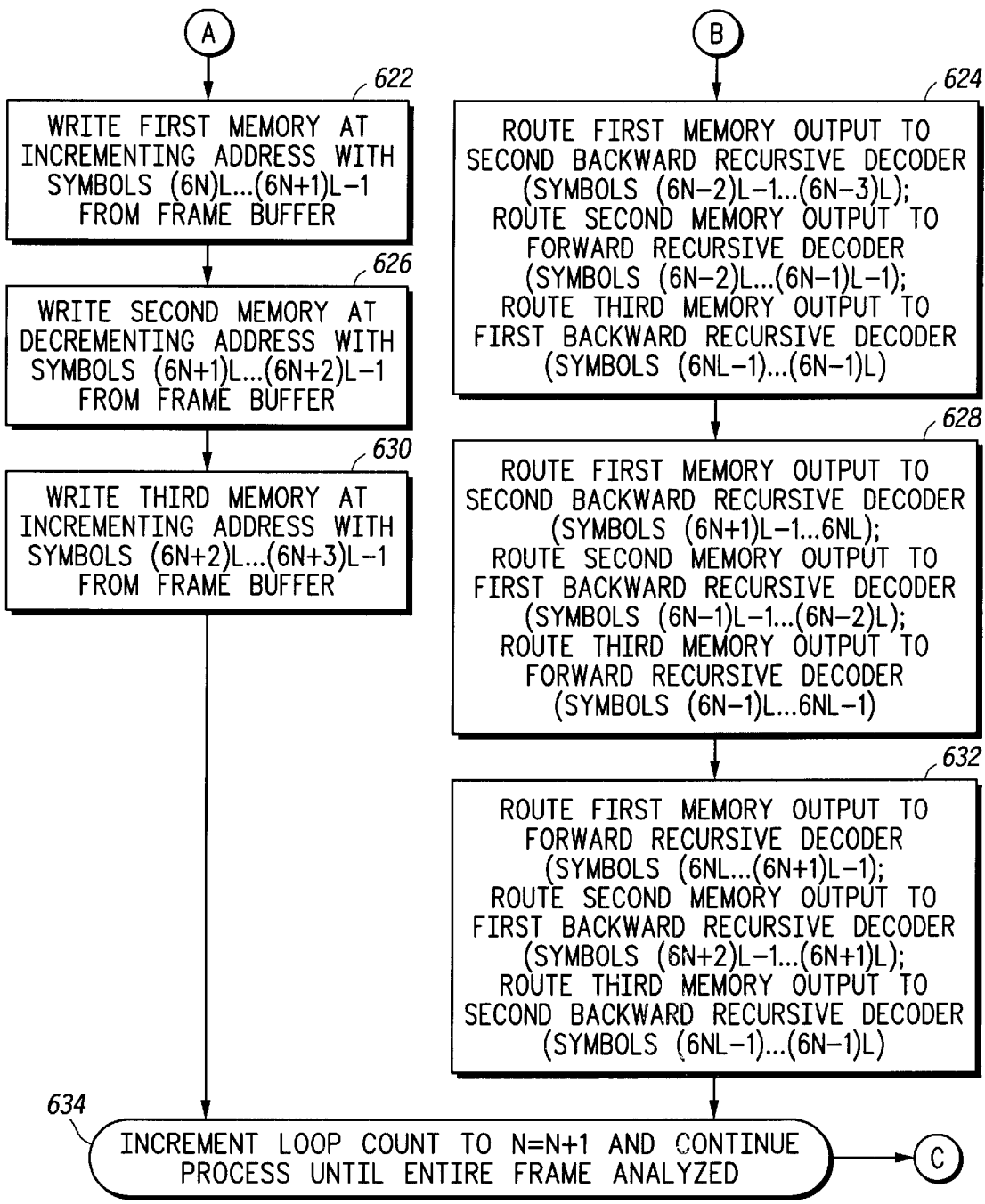
FIG.6.2

CACHE AND CACHING METHOD FOR CONVENTIONAL DECODERS

FIELD OF THE INVENTION

The invention relates generally to convolutional decoders and more particularly to convolutional decoders with forward and backward recursion, such as soft decision output decoders and methods.

BACKGROUND OF THE INVENTION

Soft decision output decoders, such as maximum a posteriori (MAP) decoders are known for use with convolutional codes to decode symbols that represent transmitted information, such as voice, video, data or other information communicated over wireless communication link. Convolutional decoders with forward and backward recursion are known and sometimes used to decode turbo codes. Such decoders perform recursive decoding which uses soft decision information from one pass of a MAP algorithm as input to a next pass of a MAP algorithm to obtain a best estimate of transmitted information data as determined from decoded symbols. As known in the art, a forward recursion decoder generally evaluates received information and determines the probability that the encoder was in a particular state from a beginning of a sequence. Backward recursion decoders compute the probability that the state of the encoder was in a given state from an end of the sequence. Hence, the computation of this probability for backward recursion decoders typically starts from an end of a frame. Such convolutional decoding may utilize seven to eight passes. One example of a MAP decoder is described, for example, in an article entitled "Near Shannon Limit Error-Correcting Coding and Decoding: Turbo-Codes",: by C. Berrou et al., Proceedings of ICC '93, Geneva, Switzerland, pp. 1064–1070, May, 1993, incorporated herein by reference.

A MAP decoder may be made up of two or more constituent decoders. For example, a MAP decoder may be made up of three constituent decoders where one processes data forward in time and two decoders process data backwards in time at staggered offsets. The frame of data to be decoded is divided into blocks of length L. All three constituent decoders run simultaneously, and the input data associated with three different blocks of the frame are needed at any given time. For example, with a turbo decoder having a forward recursion decoder and two backward recursion decoders, there is a need to buffer a frame to hold all symbols for all decoders that are running at the same time. Data must be fed to each of the decoders. Each of the decoders typically requires different symbols of the frame at different times but all decoders require data at the same time to provide efficient parallel processing.

For example, in a high speed implementation, a block or section of a frame may be processed at 60 MHz. For a rate one half decoder, two input symbols, (assuming byte-wide) are needed for every state update, requiring that an external symbol data RAM be accessed at two bytes times 60 MHz, which equals 120 megabytes per second. With no internal caching, the requirement is tripled to 360 megabytes per second, due to the three constituent decoders. Additionally, for each constituent decoder, one piece of extrinsic data (also assuming byte wide) is needed per state update. Accesses to a second external RAM would then require 60 megabytes per second per decoder, or 180 megabytes per second without caching. This can unnecessarily increase the cost of the decoders. Although the use of convolutional encoding with three constituent decoders has allowed for hardware processing (and software processing, if desired) of long turbo encoded sequences, the bandwidth required to feed input data to this high speed decoder can be prohibitive, and can lead to the addition of large amounts of internal cache memory in the decoding hardware.

One solution may be to use three different frame buffers wherein each frame buffer stores the same information and each frame buffer is dedicated for each of the constituent decoders. However, the size and cost of such an arrangement can be prohibitive. Another solution may be for each decoder to access a common frame buffer three times faster, since each decoder needs data from a same frame buffer at the same time. With seven iterations of turbo-decoding, this required increase in processing speed can drastically increase the cost of the memory.

Accordingly, there exists a need for a convolutional decoder and method with forward and backward recursion that employs a cost effective memory configuration to facilitate convolutional decoding.

BRIEF DESCRIPTION OF THE DRAWINGS

FIGS. 6.1 and 6.2 illustrate a flowchart describing one example of the operation of the cache for a convolutional decoder shown in FIG. 4.

DETAILED DESCRIPTION OF THE PREFERRED EMBODIMENT

A method and cache for caching encoded symbols for a convolutional decoder with forward and backward recursion includes storing different encoded symbols of an encoded frame in each of a plurality of symbol memory elements and routing the same encoded symbols from one of the plurality of symbol memory elements to at least both a forward recursion decoder and a backward recursion decoder. The plurality of symbol memory elements may be, for example, single port RAM cells, each operatively controlled to receive different encoded symbols of an encoded frame as input. Control logic routes the same encoded symbols from one of the plurality of symbol memory elements to all of the recursion decoders at different times.

The cache takes advantage of the fact that the same input data is used multiple times, although in a different order, in the course of decoding an entire frame. Input data for a block of length L can be fetched and cached during the time interval T before it is needed. That same block of data, such as encoded symbols, are accessed from the cache by each of two or three decoders in turn. The control logic is operatively coupled to selectively control storage of different encoded symbols of the encoded frame in each of the plurality of symbol memory elements.

In one embodiment, the control logic includes a switching circuit operatively coupled to the plurality of symbol memory elements, and control circuitry wherein the control circuitry selectively controls a switching circuit to rout encoded symbols stored in the first symbol memory element for a forward recursion decoder and also selectively routes the same first encoded symbols stored in the first symbol memory element for a backward recursion decoder. Also, if desired, where three or more decoders are used, each of the plurality of symbol memory elements may have a same address range. In this embodiment, the control logic controls a common bidirectional address pointer to route symbols to the forward recursion decoder in a first direction and to route the same symbols to the backward recursion decoder in a second direction.

Figure 1:
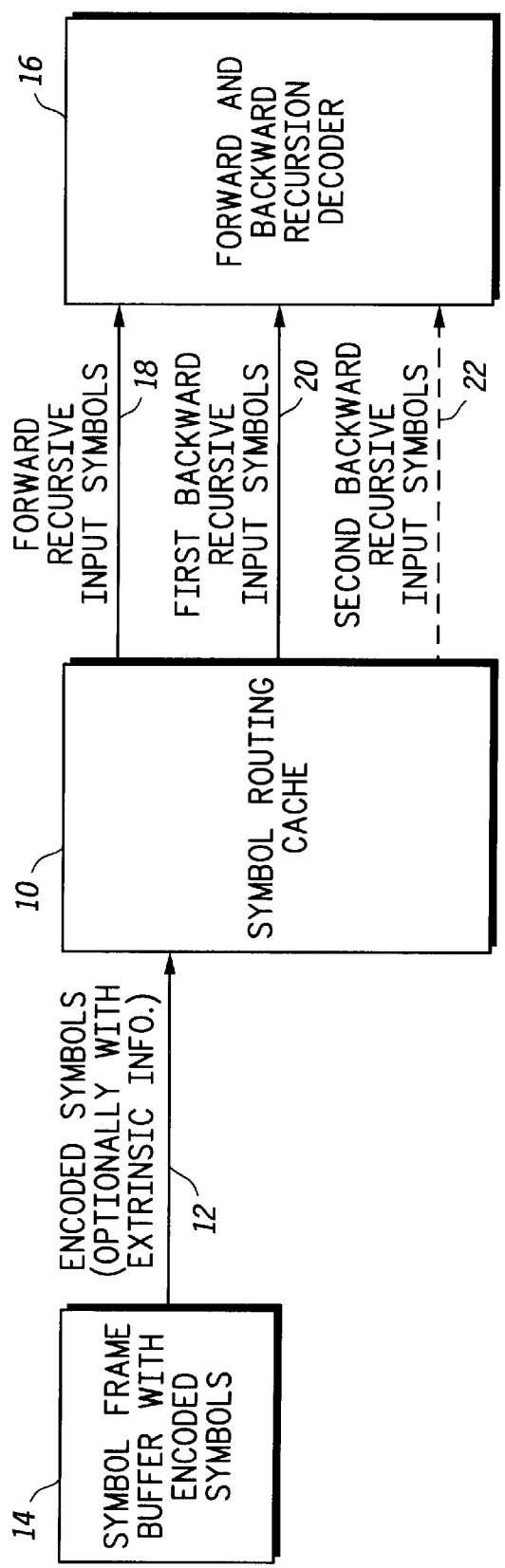
FIG. 1 is block diagram illustrating one example of a cache for a convolutional decoder with forward and backward recursion in accordance with one embodiment of the invention.

FIG. 1 illustrates a symbol routing cache 10 in accordance with the invention, that obtains encoded symbols 12, such as encoded symbols and optionally extrinsic information, if desired, from a frame buffer 14 containing the encoded symbols, or from any other suitable encoded symbol source. The symbol routing cache 10 stores different encoded symbols of an encoded frame in each of a plurality of symbol memory elements. The symbol routing cache 10 routes the same encoded symbols from one of the plurality of symbol memory elements to all forward recursion decoders and backward recursion decoders by providing forward recursive input symbols 18, first backward recursive input symbols 20, and if desired, second backward recursive input symbols 22 from the symbol memory elements. The forward and backward recursion decoders may be a conventional MAP decoder 16 having two or three or more constituent decoders, as known in the art. One example of a MAP decoder employing a sliding window technique for constituent forward, and two backward decoders is described, for example, in the paper entitled, "Efficient Implementation of Continuous MAP decoders and a Synchronisation Technique for Turbo Decoders", by Steven S. Pietrobon, International Symposium on Information Theory and its Applications, Victoria, BC Canada, pp 586–589, September 1996. Such constituent decoders may be used wherein the start of the forward recursion is time aligned with the start of the first backward recursion. However, any suitable decoders may be used.

Figure 2:
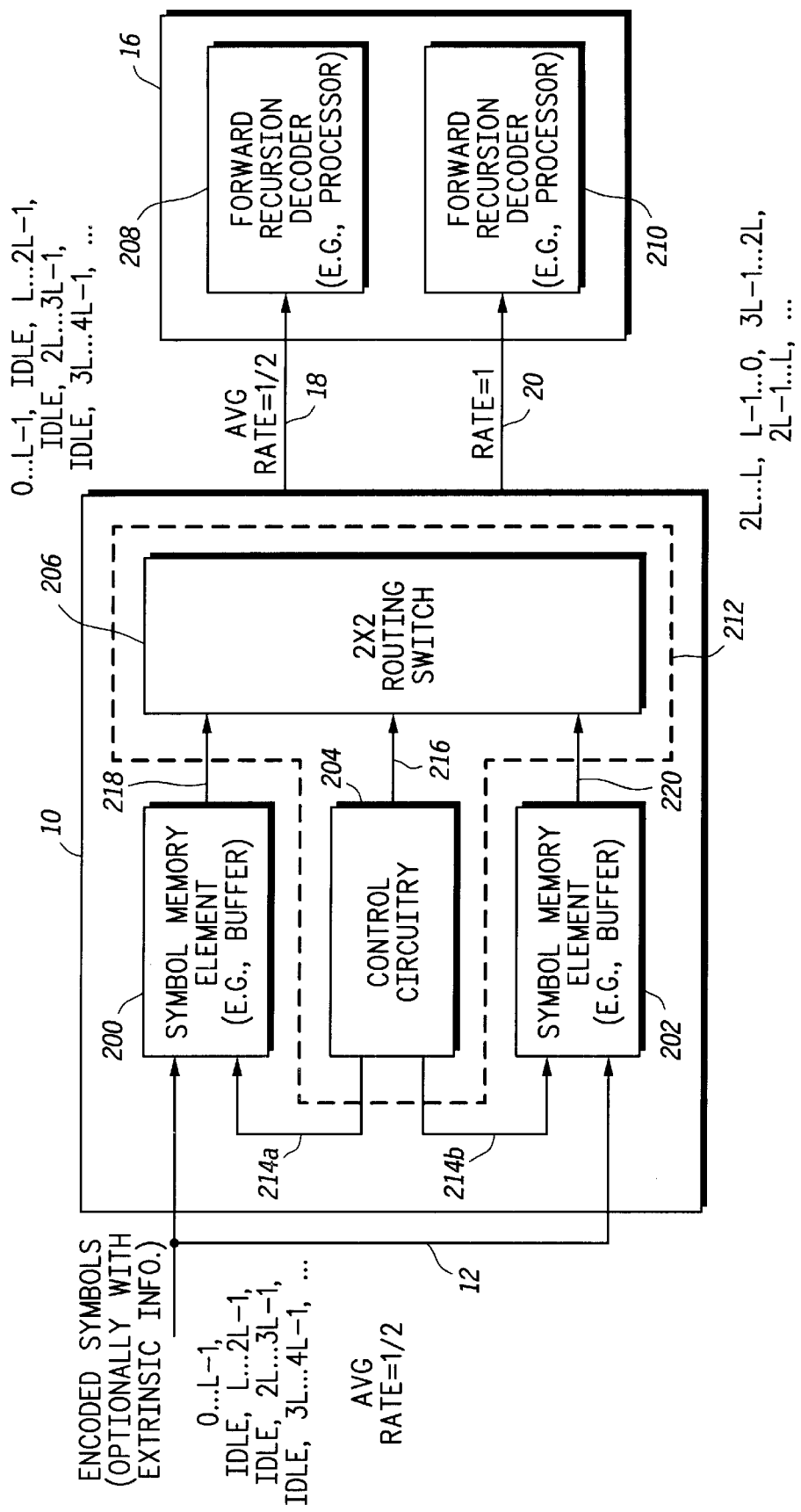
FIG. 2 is one example of a cache for a convolutional decoder having a plurality of symbol memory elements and control logic in accordance with one embodiment of the invention.

FIG. 2 illustrates in more detail one example of the symbol routing cache 10, which includes a first symbol memory element 200, a second symbol memory element 202, control circuitry 204 and routing switch 206. For purposes of illustration and not limitation, the disclosed symbol routing cache 10 will be described with reference to a convolutional decoder having a forward and backward recursion decoder 208 and 210, respectively. However, it will be recognized that any suitable number of recursion decoders may be used, as desired.

The control circuitry 204 and routing switch 206 make up control logic 212 that is used to route the same encoded symbols from one of the plurality of symbol memory elements 200 and 202 to the forward recursion decoder 208 and the backward recursion decoder 210.

The symbol memory elements 200 and 202 may be, for example, RAM cells in an application specific integration circuit (ASIC), stand alone RAM devices, or any other suitable storage elements as desired. Each of the symbol memory elements 200 and 202, in this embodiment, is a single port RAM that allows simultaneous read and writes. Such RAMs are available, for example, as embedded elements in FPGAs manufactured by Xilinx in San Jose, Calif. However, any other suitable memory element may also be used. The control circuitry 204 may be implemented as any suitable control logic in the form of hardware, software, a suitable combination thereof, including but not limited to, microprocessors, DSP'S, state machines, or any other suitable implementation. The routing switch 206 may be any suitable two by two multiplexer or switching matrix.

The control logic 212 controls the plurality of symbol memory elements 200 and 202 to receive different encoded symbols of an encoded frame as input, so that each of the plurality of symbol memory elements 200 and 202 store different blocks L of an encoded frame. The control logic 212 provides symbol memory element control signals 214a and 214b to control the symbol memory elements 200 and 202, respectively, and also generates a routing switch control signal 216 to control the routing switch 206.

As shown, the symbol memory elements 200 and 202 are single port RAMs. The routing switch 206 is a dual input port and dual output port switching matrix. The symbol memory element 200 has an input operatively coupled to receive encoded symbols 12 of the encoded frame. The symbol memory element 200 also has an output that provides output symbols 218 to the routing switch 206. Similarly, the symbol memory element 202 has an input operatively coupled to receive encoded symbols of the encoded frame and also has an output to output symbols 220 to the routing switch 206. The routing switch 206 is operatively coupled to output (e.g., route) symbols 218 and 220 and receive the routing switch control signal 216. The control circuitry 204 selectively controls the routing switch 206 (i.e., switching circuit) to output encoded symbols stored in the symbol memory element 200 for the forward recursion decoder 208 and also selectively routes the same encoded symbols stored in first symbol memory element 200 for the backward recursion decoder 210, such that symbols 218 are provided to both the forward recursion decoder 208 and the backward recursion decoder 210 at different points in time. As such, the symbols 218 serve as forward recursive input symbols 18 for the forward recursion decoder and at a different point in time serve as the backward recursive input symbols 20 for the backward recursion decoder. Similarly, symbols 220 are selectively routed to the forward recursion decoder 208 and to the backward recursion decoder 210 at different times, such that the symbols 220 serve as forward recursive input symbols 18 and backward recursive input symbols 20 at different points in time.

The control logic 212 selectively controls storage of different encoded symbols of the encoded frame in each of the plurality of symbol memory elements 200 and 202. The control logic 212 obtains the encoded frame in the form of encoded symbols 12, once from the frame buffer 14 and routes different encoded symbols of the encoded frame in each of the plurality of symbol memory elements 200 and 202 prior to routing the same encoded symbols from one of the symbol memory elements 200 and 202 to both of the forward recursion decoder 208 and the backward recursion decoder 210. In this way, the same data is stored once in a symbol memory element but routed to the different recursion decoders at an appropriate time. This low complexity cache implementation uses a minimal amount of internal RAM. In this embodiment, the symbol memory elements 200 and 202 consist of separate single port memory banks with a width equal to the input data symbols, such as three symbols and extrinsic information, and a depth of L, which is equal to the designated window. The banks are grouped into a single cache that has two read ports (one on each memory bank) and one write port. A separate address pointer is used for each memory element since the memory elements are accessed in opposite directions during specified time windows. With using RAMs with simultaneous read and write capability, read data is overwritten with new data once it is read by the respective recursion decoder. A reverse ordering of the bidirectional address pointer through incrementing and decrementing, is performed each time a particular symbol memory element is accessed. However, it will be recognized that the symbol memory elements may be configured with different address pointers and have different address ranges. In the described implementation, each of the symbol memory elements has the same address range and only one memory element is receiving encoded symbols at a time. However, both memory elements are accessed in opposite directions during some time periods.

The disclosed cache may be incorporated in a mobile unit, such as a portable radiotelephone, information appliance, hand held device, or any other suitable device which employs convolutional decoding.

In addition, the disclosed symbol routing cache for a convolutional decoder may be employed in a wireless network receiver element, such as a base site transceiver station (BTS) in a wireless cellular network, or any other suitable network element in a wireless communication network wherein such a receiver employs a convolutional decoder with forward and backward recursion. For example, code division multiple access (CDMA) systems or any other suitable elements that incorporate convolutional decoders, may benefit from the invention.

Figure 3:
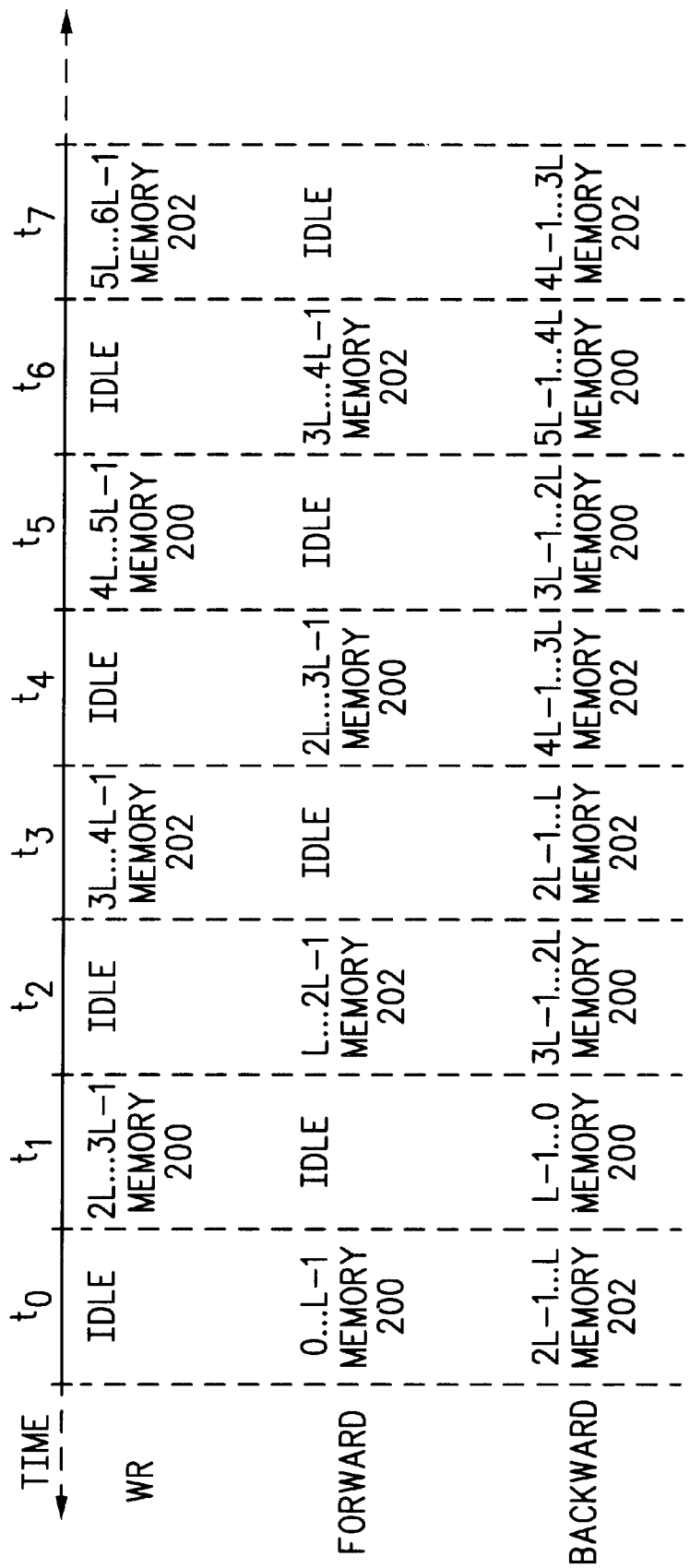
FIG. 3 is a diagram illustrating symbol storage sequencing and routing by a cache for a convolutional decoder in accordance with one embodiment of the invention.

FIG. 3 diagrammatically illustrates an example of the storage and routing of encoded symbols by the symbol routing cache 10. For example, at the time T0, it is assumed that symbol memory element 200 has already been controlled to receive and store encoded symbols represented by a window 0..L-1. This portion of the encoded frame is routed by the routing switch 206 under control of the control circuitry 204 to the forward recursion decoder 208. At the same time, the control circuitry 204 controls the routing switch 206 to route encoded symbols represented by 2L-1..L from the symbol memory element 202 to the backward recursion decoder 210. The control circuitry 204 uses memory control signals 214a and 214b to effectively disable symbol memory elements so that they may not be written to during this time. As such, from a write standpoint, they are idle. As shown at time T1, symbol memory element 200 is controlled by control circuitry 204 through control signal 214a to reverse direction of the address pointer to provide the encoded symbols L-1..0 in reverse order to the backward recursion decoder 210. At the same time, the control circuitry 204 enables the symbol memory element 200 to receive encoded symbols 2L..3L-1, such that a simultaneous read and write operation occurs with respect to symbol memory element 200. The forward recursion decoder 208 does not receive additional information and is indicated as being idle. In time T2, the control circuitry 204 again idles the writing capabilities to the symbol memory element 200 and 202. In addition, the address pointer for the symbol memory element 202 is decremented to provide a forward order of information to the forward recursion decoder 208 to provide encoded symbols L..2L-1. In addition, symbol memory element 200 is controlled by the control circuitry 204 through control signal 214a to provide an incrementing address pointer so that the routing switch 206 can provide encoded signals corresponding to 3L-1..2L from symbol memory element 200 to the backward recursion decoder 210. The process continues as shown for additional windows of an encoded frame.

Figure 4:
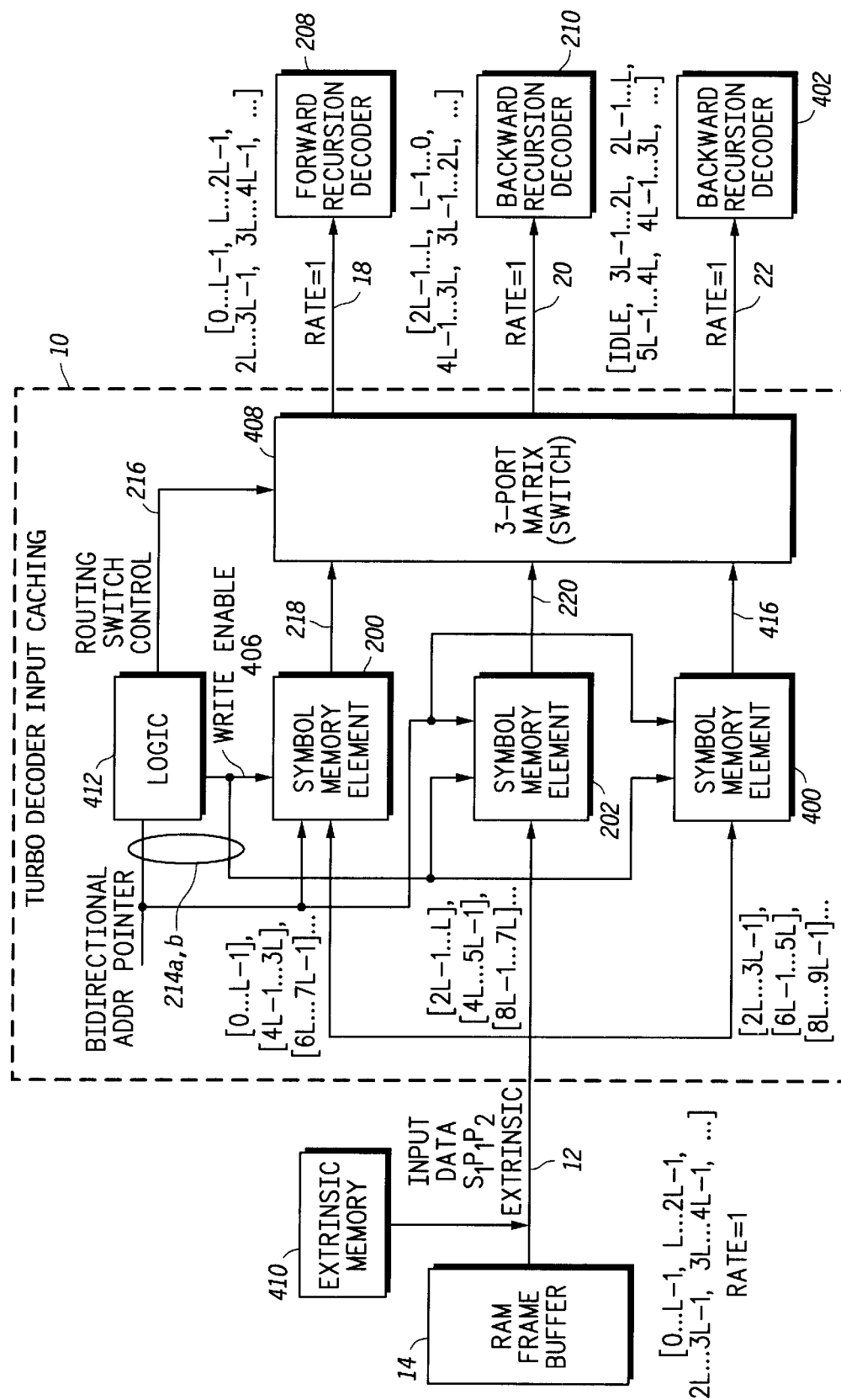
FIG. 4 is an alternative embodiment of an example of a cache for a convolutional decoder in accordance with one embodiment of the invention.

FIG. 4 illustrates an alternative embodiment of the symbol routing cache 10 which includes an additional symbol memory element 400 and backward recursion decoder 402, so that three recursion decoders can be used. In this example, there includes a forward recursion decoder 208 and two backward recursion decoders 210 and 402. In addition, the memory element control signals 214a and 214b are shown to include a bidirectional address pointer 404 and memory write enable bus 406. The bidirectional address pointer 404 controls which address within a selected symbol memory element will be written to. A single address pointer alternates between incrementing and decrementing and indexes the cache. For example, all symbol memory elements have the same address range wherein the control logic 212 enables one symbol memory element to receive symbols from the frame buffer at any one time. Accordingly, each of the plurality of symbol memory elements 200, 202 and 400 is responsive to a common bidirectional address pointer. The control logic 212 controls the common bidirectional address pointer to route symbols to the forward recursion decoder 208 in a first direction, such as when incrementing, and routes the same symbols to the backward recursion decoder 210 in a second direction, such as by decrementing the address pointer. The write enable bus 406 provides write enable signals for each of the symbol memory elements 200, 202 and 400 so that each of the symbol memory elements 200, 202, 400 can be selectively disabled so that they are idle to avoid writes to the symbol memory element. In this embodiment, a three port routing switch 408 is used, which may be, for example, a 3×3 switch matrix which provides selected encoded symbols to the respective forward and backward recursion decoders 208, 210 and 402. Also shown is memory 410, containing extrinsic information, which is included as input information, referred to herein as encoded symbols 12, to the symbol routing cache 10.

In this embodiment, control circuitry includes logic 412 and controls the write enable bus 406 to control which memory element is enabled to receive symbols. Hence, the logic 412 selectively routes encoded symbols 12 to a selected symbol memory element. The symbol routing cache shown in FIG. 4 operates substantially identically to that described with reference to FIG. 2, except that an additional symbol memory element 400 is used to provide information to all three recursion decoders 208, 210 and 402. In addition, the rate at which information is received from the frame buffer is constant and at the same rate that the recursion decoders receive their necessary information. This is in contrast to the embodiment of FIG. 2 which may provide an average rate of one half to a forward recursion decoder.

The symbol memory element 400 has an input that is coupled to receive encoded symbols of an encoded frame that are not stored in the other symbol memory elements 200 and 202. In addition, the symbol memory element 400 has an output that provides symbols 416 to each of the forward recursion decoder 208, the first backward recursion decoder 210 and to the second backward recursion decoder 402. The symbols 416 are selectively routed to the appropriate recursion decoder through logic 412 via the three port routing switch 408. Hence, the control circuitry selectively controls the three port routing switch 408 to route encoded symbols stored in the symbol memory element 200 for the forward recursion decoder and at a different time routes the same encoded symbols stored in the first symbol memory element 200 for the backward recursion decoder 210 and at a different point in time routes the same encoded symbols stored in the symbol memory element 200 for the backward recursion decoder 402. This routing is also performed for encoded symbols stored in each of the other two symbol memory elements 202 and 400.

Figure 5:
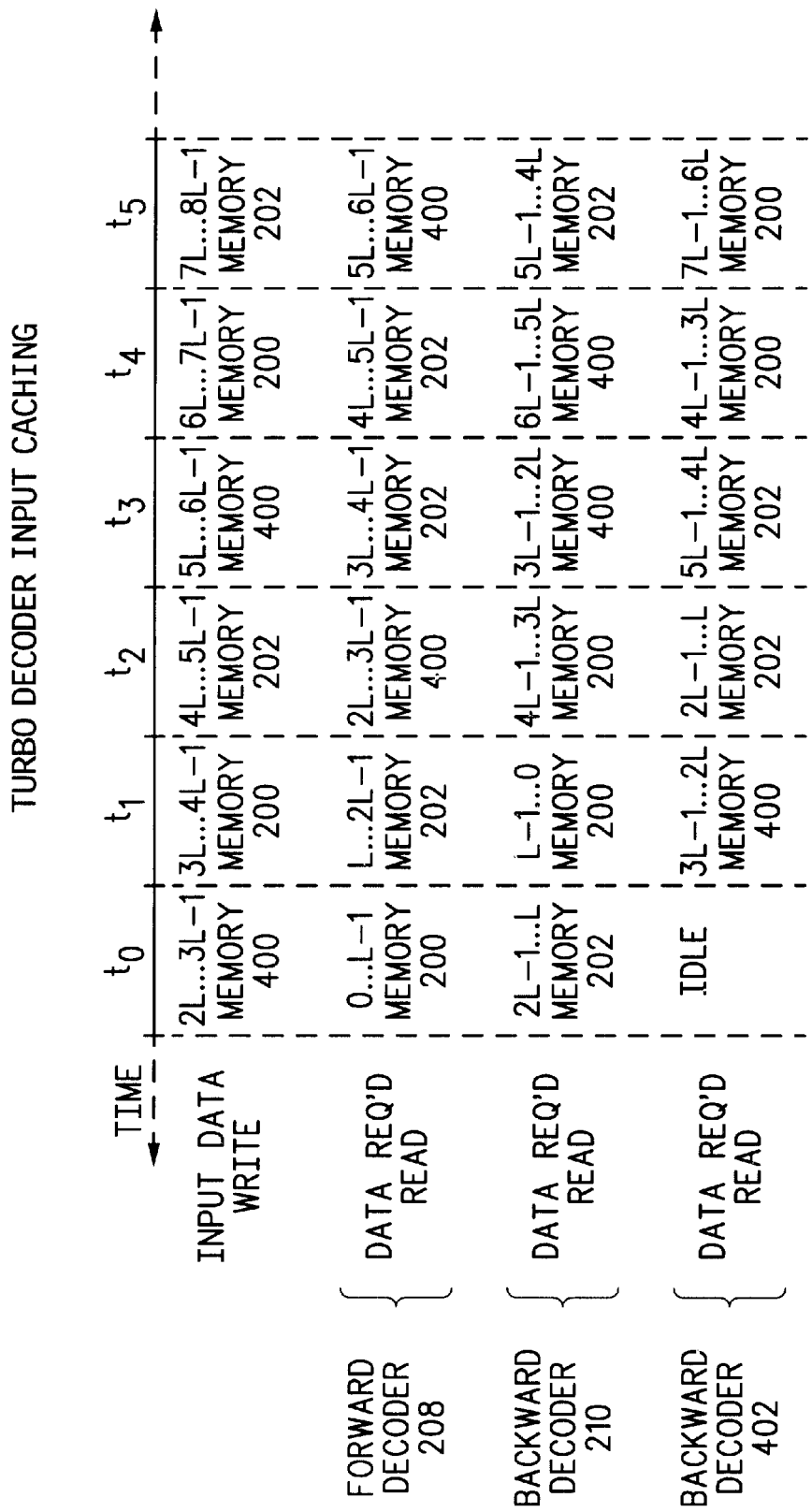
FIG. 5 is a diagram illustrating routing of encoded symbols from a plurality of symbol memory elements in accordance with one embodiment of the invention.

Referring to FIGS. 5, 6.1 and 6.2, one example of the operation of the symbol routing cache 10 of FIG. 5 will be described. As shown in block 600 of FIG. 6.1, the decoder buffers a frame of received encoded symbols in the frame buffer 14 of FIG. 4. As shown in block 602, 604 and 606, the symbol memory elements 200, 202 and 400 obtain different portions of the encoded frame for storage in the different symbol memory elements. As shown in block 602, the logic controls a memory select switch to write the symbol memory element 200 with symbols 0 through L- 1 by incrementing the bidirectional address pointer. As shown in block 604, the symbol memory element 202 is enabled and the control logic 412 decrements addresses to store received symbols L..2L-1 to store symbols in the reverse order 2L-1. . . L. As shown in block 606, the symbol memory element 400 is then written to through the memory select switch using incremented addresses for symbols 2L . . . 3L-1 from the frame buffer 14 (FIG. 4). The logic also controls the three port routing switch 408 to route symbols 218 from the symbol memory element 200 to the forward recursive decoder 208, namely, symbols 0..L- 1. At the same time, the symbols 220 are output to the backward recursive decoder. This is shown in block 608. Hence, the method includes routing different encoded symbols of the encoded frame in each of the plurality of symbol memory elements to populate the symbol memory elements and subsequently route the same encoded symbols from one of the symbol memory elements to all of the recursion decoders, at different times.

The process continues with setting a loop counter value N equal to 1 as shown in block 609. As shown in blocks 610–632, additional required windows of symbols, are stored and routed by performing writes and reads to and from the symbol memory elements as shown. Hence the process continues to write to a given memory element and read from all three symbol memory elements as required. In this embodiment, N is incremented every time six windows are analyzed. As shown in block 634 of FIG. 6.2, the process includes incrementing the loop counter value N until an entire frame is analyzed.

Accordingly a high speed turbo-decoder implementation uses, in this example, three constituent decoders, and provides for real time processing of long turbo encoded sequences. Timing relationships between the constituent decoders allows for a low complexity caching scheme as described herein. The disclosed cache and caching methods identify the pattern of data usage by the constituent decoders and effectively use the same data multiple times in the course of decoding. Preferably, the cache is an on-chip cache in the form of hardware as part of a decoder. However, it will be recognized that off-chip caching may also be used, if desired. In addition, a lower amount of internal RAM is used for caching and there is no substantial increase in latency since reads and writes to the cache occur substantially simultaneously.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A cache for a convolutional decoder with forward and backward recursion comprising:

a plurality of symbol memory elements each operatively controlled to receive different encoded symbols of an encoded frame as input; and control logic, operatively coupled to a frame buffer containing encoded symbols and to the plurality of symbol memory elements, that is capable of selectively controlling storage of different encoded symbols of the encoded frame in each of the plurality of symbol memory elements by obtaining the encoded frame from the frame buffer and routing different encoded symbols of the encoded frame in each of the plurality of symbol memory elements, and that is further capable of routing same encoded symbols from one of the plurality of symbol memory elements as input to at least both of a forward recursion decoder and a backward recursion decoder.

2. The cache of claim 1 wherein each of plurality of symbol memory elements has a same address range and wherein the control logic enables one symbol memory element to receive symbols from a frame buffer at any one time.

3. A cache for a convolutional decoder with forward and backward recursion comprising:

a plurality of symbol memory elements each operatively controlled to receive different encoded symbols of an encoded frame as input, wherein the plurality of symbol memory elements comprises:

a first symbol memory element having a first input operatively coupled to receive first encoded symbols of the encoded frame and having a first output;

a second symbol memory element having a second input operatively coupled to receive second encoded symbols of the encoded frame and having a second output; and control logic, operatively coupled to the plurality of symbol memory elements, to route same encoded symbols from one of the plurality of symbol memory elements as input to at least both of a forward recursion decoder and a backward recursion decoder, wherein the control logic includes a switching circuit operatively coupled to the first and second outputs, and control circuitry operatively coupled to the first symbol memory element, the second symbol memory element, and the switching circuit wherein the control circuitry selectively controls the switching circuit to route the first encoded symbols stored in the first symbol memory element for a forward recursion decoder and also selectively routes the same first encoded symbols stored in the first symbol memory element for a backward recursion decoder.

4. The cache of claim 3 wherein the plurality of symbol memory elements includes a third symbol memory having a third input operatively coupled to receive third encoded symbols of the encoded frame and having a third output, and wherein the switching circuit is operatively coupled to the third symbol memory and the control circuitry selectively controls the switching circuit to route the first encoded symbols stored in the first symbol memory element for a forward recursion decoder, route the same first encoded symbols stored in the first symbol memory element for a first backward recursion decoder and route the same first encoded symbols stored in the first symbol memory element for a second backward recursion decoder.

5. The cache memory of claim 4 wherein each of the plurality of symbol memory elements is responsive to a common bidirectional address pointer wherein the control logic controls the common bidirectional address pointer to route symbols to the forward recursion decoder in a first direction and to route the same symbols to the first and second backward recursion decoders in a second direction.

6. The cache of claim 1 wherein the plurality of symbol memory elements include a plurality of random access memories with simultaneous read and write capabilities.

7. The cache of claim 1 where each encoded symbol includes extrinsic information.

8. The cache of claim 1 wherein each of the plurality of symbol memory elements is configured with different pointers and different address ranges.

9. A mobile unit comprising:
 a convolutional decoder with at least a forward recursion decoder and a first backward recursion decoder;
 a symbol frame buffer containing stored received symbols for decoding by the convolutional decoder; and
 a symbol routing cache having an input that receives stored received symbols of an encoded frame from the symbol frame buffer, a first output and a second output wherein the first output is operatively coupled to provide the forward recursion decoder with forward recursive input symbols at the same time the second output provides the first backward recursion decoder with backward recursive input symbols.

10. The mobile unit of claim 9 wherein the convolutional decoder includes a second backward recursion decoder and wherein the symbol routing cache includes a third output operatively coupled to the second backward recursive decoder wherein the symbol routing cache provides second backward recursive input symbols to the second backward recursive decoder.

11. The mobile unit of claim 9 wherein the symbol routing cache includes:
 a plurality of symbol memory elements each operatively controlled to receive different encoded symbols of the encoded frame as input; and
 control logic, operatively coupled to the plurality of symbol memory elements, to route same encoded symbols from one of the plurality of symbol memory elements as input to at least both of the forward recursion decoder and the first backward recursion decoder.

12. A wireless network receiver element comprising:
 a convolutional decoder with forward and backward recursion;
 a symbol frame buffer containing stored received symbols for decoding by the convolutional decoder with forward and backward recursion; and
 a symbol routing cache having an input that receives stored received symbols from the symbol frame buffer, a first output and a second output wherein the first output is operatively coupled to provide the convolutional decoder with forward recursive input symbols at the same time the second output provides backward recursive input symbols to the convolutional decoder.

13. The wireless network receiver element of claim 12 wherein the convolutional decoder includes a second backward recursion decoder and wherein the symbol routing cache includes a third output operatively coupled to the second backward recursive decoder wherein the symbol routing cache provides second backward recursive input symbols to the second backward recursive decoder.

14. The wireless network receiver element of claim 12 wherein the symbol routing cache includes:

a plurality of symbol memory elements each operatively controlled to receive different encoded symbols of the encoded frame as input; and
 control logic, operatively coupled to the plurality of symbol memory elements, to route same encoded symbols from one of the plurality of symbol memory elements as input to at least both of the forward recursion decoder and the first backward recursion decoder.

15. A method for caching encoded symbols for a convolutional decoder with forward and backward recursion comprising the steps of:
 obtaining an encoded frame from a frame buffer;
 routing different encoded symbols of the encoded frame in each of the plurality of symbol memory elements and storing the routed encoded symbols in the corresponding symbol memory elements; and
 routing same encoded symbols from one of the plurality of symbol memory elements to at least both of a forward recursion decoder and a backward recursion decoder.

16. The method of claim 15 wherein each of the plurality of symbol memory elements has a same address range and including the step of enabling one symbol memory element to receive symbols from a frame buffer at any one time.

17. A method for caching encoded symbols for a convolutional decoder with forward and backward recursion comprising the steps of:
 storing different encoded symbols of an encoded frame in each of a plurality of symbol memory elements, wherein storing comprises:
  storing first encoded symbols of the encoded frame in a first symbol memory element;
  storing second encoded symbols of the encoded frame in a second symbol memory element;
  storing third encoded symbols of the encoded frame in a third symbol memory element;
 selectively routing the first encoded symbols in the first symbol memory element for a forward recursion decoder, selectively routing the same first encoded symbols in the first symbol memory element for a first backward recursion decoder and selectively routing the same first encoded symbols for a second backward recursion decoder;
 selectively routing the second encoded symbols for the forward recursion decoder, the first backward recursion decoder and the second backward recursion decoder; and
 selectively routing the third encoded symbols for the forward recursion decoder, the first backward recursion decoder and the second backward recursion decoder.

18. The method of claim 17 wherein the step of storing different encoded symbols of an encoded frame in each of a plurality of different symbol memory elements includes selectively routing received encoded symbols of the encoded frame in each of the plurality of different symbol memory elements based on a common bidirectional address pointer.

19. The method of claim 15 wherein each encoded symbol includes extrinsic information.

20. The method of claim 15 including the step of storing different encoded symbols of an encoded frame in each of a plurality of different symbol memory elements based on different address pointers and different address ranges associated with the different symbol memory elements.

* * * * *